(12) United States Patent
Ahmad

(10) Patent No.: US 9,448,937 B1
(45) Date of Patent: Sep. 20, 2016

(54) CACHE COHERENCY

(71) Applicant: Xilinx, Inc., San Jose, CA (US)

(72) Inventor: Sagheer Ahmad, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 128 days.

(21) Appl. No.: 14/462,454

(22) Filed: Aug. 18, 2014

(51) Int. Cl.
*G06F 12/00* (2006.01)
*G06F 12/08* (2016.01)
*G06F 13/00* (2006.01)
*G06F 13/28* (2006.01)
*G06F 17/50* (2006.01)

(52) U.S. Cl.
CPC ....... *G06F 12/0815* (2013.01); *G06F 17/5027* (2013.01)

(58) Field of Classification Search
CPC .................. G06F 12/0815; G06F 17/5027
See application file for complete search history.

(56) References Cited

U.S. PATENT DOCUMENTS

| | | | | |
|---|---|---|---|---|
| 5,940,870 A * | 8/1999 | Chi | ..................... | G06F 12/0692 709/216 |
| 6,631,447 B1 * | 10/2003 | Morioka | ............. | G06F 12/0815 711/118 |
| 6,854,048 B1 * | 2/2005 | Dice | ................... | G06F 9/30181 711/147 |
| 2003/0163649 A1 * | 8/2003 | Kapur | ................ | G06F 12/0813 711/146 |
| 2006/0224831 A1 * | 10/2006 | Yoshikawa | ......... | G06F 12/0806 711/137 |
| 2011/0264888 A1 * | 10/2011 | Dasu | ................... | G06F 15/7867 712/15 |

* cited by examiner

*Primary Examiner* — Mark Giardino, Jr.
(74) *Attorney, Agent, or Firm* — LeRoy D. Maunu; Jonathan B. Soike

(57) ABSTRACT

A system is disclosed that includes a memory, a processing sub-system, and a programmable logic sub-system. The processing and programmable logic sub-systems each include a respective circuit configured to access a first set of memory addresses that are shared by the processing and programmable logic sub-systems. Each of the processing and programmable logic sub-systems also include a respective cache circuit, configured to cache the first set of addresses of the first memory, and a respective coherent interface circuit configured to communicate data transactions between the respective cache circuit and the memory. The system also includes a cache coherent interconnect configured to maintain coherency between the first cache circuit and the second cache circuit for the first set of addresses.

19 Claims, 4 Drawing Sheets

CACHE COHERENCY

FIELD OF THE INVENTION

The disclosure generally relates to integrated circuits (ICs) and more particularly to cache coherency.

BACKGROUND

Programmable integrated circuits (ICs) are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile may include both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a configuration data stream into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include an embedded processor that is capable of executing program code. The processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring programmable circuitry of an IC results in the implementation of different physical circuitry as specified by the configuration data within the programmable circuitry.

SUMMARY

A system is disclosed that includes a memory, a processing sub-system, and a programmable logic sub-system. The processing sub-system includes one or more processing circuits configured to access a first set of addresses of the first memory. The processing sub-system also includes a first cache circuit, configured to cache the first set of addresses of the first memory, and a first coherent interface circuit configured to communicate data transactions between the first cache circuit and the memory.

The programmable logic sub-system includes a set of programmable resources configured to implement a logic circuit, a second cache circuit, and a second coherent interface circuit. The logic circuit is specified in a set of configuration data and configured to access the first set of addresses of the first memory. The second cache circuit is configured to cache the first set of addresses of the first memory. The second coherent interface circuit is configured to communicate data transactions between the second cache circuit and the memory. The cache coherent interconnect is configured to maintain coherency between the first cache circuit and the second cache circuit for the first set of addresses.

A method is also disclosed for operating a programmable integrated circuit (IC). A software program is executed with a processing circuit of a processing sub-system of the programmable IC. The software program is executed using a first set of addresses of a memory to store one or more variables of the program. Data values for the first set of addresses of the memory are cached in a first cache circuit included in the processing sub-system. A logic circuit and a second cache circuit are operated in programmable resources of a programmable logic sub-system of the programmable IC. The logic circuit is configured to access the first set of addresses of the memory. Data values for the first set of addresses of the memory are also cached in the second cache circuit implemented in the programmable logic sub-system. Coherency between the first cache circuit and the second cache circuit is maintained for the first set of addresses using a cache coherent interconnect. The cache coherent interconnect is coupled to the memory, the processing sub-system, and the programmable logic sub-system.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION OF THE DRAWINGS

In some applications, a processing sub-system and a programmable logic sub-system of a programmable IC may be used to implement respective portions of a user design. For instance, a user design may include software executed on the processing sub-system and a circuit design implemented by the programmable logic sub-system. The programmable logic sub-system and/or other hardware circuits may exchange data values with the software portion of the user design by accessing memory locations used by the processing sub-system to store variables of the software during execution.

Often shared data values are cached to improve performance. When values are stored in a cache, a coherency scheme is employed to maintain coherency between the cache and the memory. In one coherency scheme, referred to as software coherency, shared data produced by the processing sub-system is flushed from the cache of the processing sub-system to memory before another sub-system or devices can access the shared data from the memory. Conversely, before the processing sub-system accesses data produced by another sub-system or device for a shared memory address, the cache of the processing sub-system invalidates the cached data for the shared memory address. Data in caches of other sub-systems or devices may be similarly flushed (or invalidated) in response to shared memory addresses being accessed by the processing sub-system. However, if devices or sub-systems frequently exchange shared data with the processing system, the cache flushes and/or invalidations of cache lines may incur significant data overhead and/or reduce performance.

In one or more implementations, a system includes a processing system having a first cache and a programmable logic sub-system having a second cache implemented in programmable resources. The first and second caches are configured to cache values of memory addresses that are shared between the processing and programmable logic sub-systems. The system includes a cache coherent interconnect circuit configured to maintain coherency between the first and second caches for the shared memory addresses.

In some implementations, the cache coherent interconnect is configured to maintain coherency by snooping the cache of one of the two sub-systems in response to a data transaction request for a shared memory address from the other sub-system. When a cache is snooped, a cached data value is retrieved directly from the cache without first flushing the data value from the cache to the memory. By snooping data from the caches for data transactions of the processing and programmable sub-systems that access the shared memory addresses, traffic to and from the memory may be reduced, and performance may be improved.

Figure 1:
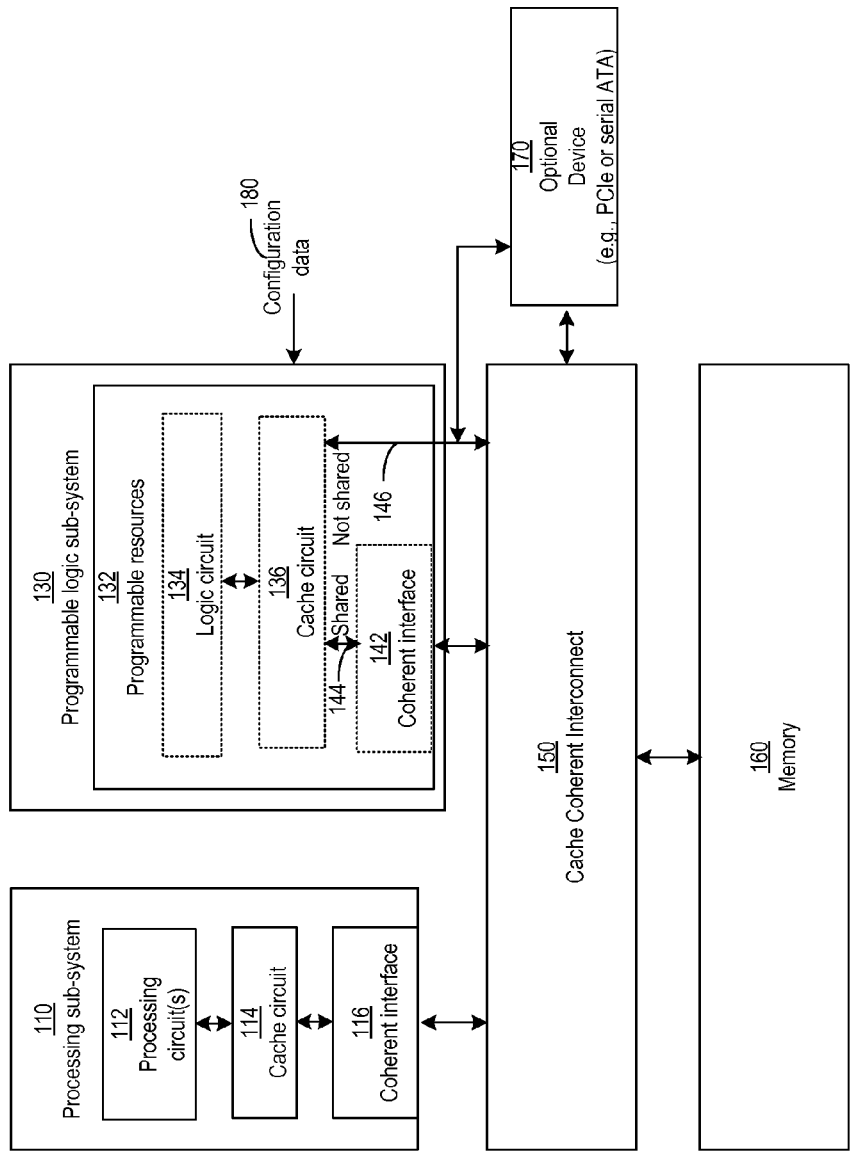
FIG. 1 shows a first system implementing cache coherency between programmable-logic and processing sub-systems, consistent with one or more implementations.

Turning now to the figures, FIG. 1 shows a first system implementing cache coherency between programmable-logic and processing sub-systems. The system includes a memory 160, a processing sub-system 110, and a programmable logic sub-system 130. The processing sub-system 110 includes one or more processing circuits 112 configured to execute software programs using addresses of the memory 160 for storage of data variables. The processing sub-system 110 includes a first cache circuit 114 configured to cache data values for a first set of addresses of the memory 160 that are accessed by the processing circuits 112. The processing sub-system 110 also includes a first coherent interface circuit 116 configured to communicate data transactions between the first cache circuit 114 and the cache coherent interconnect 150.

The programmable logic sub-system 130 includes a set of programmable resources 132 configured by a set of configuration data 180 to implement a set of circuits 134, 136, and 142 (shown as dashed lines). In this example, the set of circuits implemented by programmable resources 132 include a logic circuit 134 configured to access the first set of addresses of the memory 160 to exchange data with the processing circuit(s) 112 of the processing sub-system 110. The programmable logic sub-system 130 includes a second cache circuit 136 configured to cache the first set of addresses of the memory 160 and a second coherent interface circuit (142) configured to communicate data transactions between the second cache circuit and the cache coherent interconnect 150.

In some implementations, the logic circuit 134 is also configured to access a second set of addresses of the memory 160 that are not shared with the processing circuits 112 and which do not need to be cached. For instance, the logic circuit may write to a memory address corresponding to device 170 on a data bus. The caching circuit 136 routes data transactions corresponding to the set of shared memory addresses on first data path 144 via the coherent interface 142. The cache circuit 136 routes data transactions, corresponding to addresses other than the set of shared addresses, via a second data path 146 that bypasses the coherent interface 142.

The system includes a cache coherent interconnect 150 configured to maintain coherency between the first cache circuit and the second cache circuit for a set of memory addresses that are shared between the processing and programmable logic sub-systems (i.e., included in the first set of memory addresses). In some implementations, the cache coherent interconnect 150 maintains coherency between the processing or programmable logic sub-systems by snooping the cache of one of the two sub-systems in response to a data transaction request for a shared memory address from the other sub-system. More specifically, the cache is snooped to retrieve a data value directly from the cache without first flushing the data value from the cache to the memory. For ease of reference, snooping an address of a cache to retrieve a data value directly from the cache may be described as snooping of a data value.

In some implementations, the cache coherent interconnect 150 maintains cache line ownership of the shared addresses. As one example, the cache coherent interconnect 150 may receive a data transaction request from the processing sub-system for a memory that does not have cache line ownership of the address. Such a transaction request may be issued from a sub-system in response to a situation known as a cache miss, where the cache in the sub-system does not presently store a value for the address specified in the transaction request. If the programmable logic sub-system 130 has cache line ownership of the memory address indicated in the data transaction request, the cache coherent interconnect 150 snoops a data value for the memory address from the cache circuit 136 of the programmable logic sub-system 130 and then transfers the cache line ownership for the memory address to the processing sub-system 110.

Conversely, if the programmable logic sub-system 130 issues a data transaction request for a memory address owned by the processing sub-system 110, the cache coherent interconnect 150 snoops a data value for the memory address from the cache circuit 114 of the processing sub-system 110 and then transfers the cache line ownership for the memory address to the programmable logic sub-system 130.

In some implementations, the cache coherent interconnect may be configured to allow other devices or sub-systems to access the set of shared memory addresses while maintaining coherency between the caches of the processing and programmable logic sub-systems for these addresses. For example, a system may include a device 170, such as Serial ATA or PCIe communication devices to access the memory addresses shared between the processing and programmable logic sub-systems. For example, the cache coherent interconnect 150 may receive a read transaction request, indicating one of the shared memory addresses, from a communication device that does not cache the shared memory addresses. To process the data transaction request, the cache coherent interconnect 150 determines which one of the cache circuits 114 or 136 has cache line ownership of the memory address and requests a snoop of the cached data value for the memory address from the determined one of the cache circuits. In contrast to this approach, some conventional approaches require the data to be flushed to memory and then retrieved from memory by the requesting device.

As another example, the cache coherent interconnect 150 may receive a write transaction request, indicating one of the shared memory addresses, from a communication device that does not cache the shared memory addresses. In response to the write request, the cache coherent interconnect 150 determines which one of the first or second caches is assigned cache line ownership for the memory address indicated in the write request. The cache coherent interconnect 150 invalidates a data value for the memory address in the determined one of the caches to the memory and forwards the write transaction request to the memory.

In some implementations, the cache coherent interconnect 150 may be a hardwired circuit connected to the processing sub-system 110, programmable logic sub-system 130, and memory 160, as shown in FIG. 1. In some other implementations, the cache coherent interconnect 150 may be implemented by programmable resources 132 of the programmable logic sub-system 130.

Figure 2:
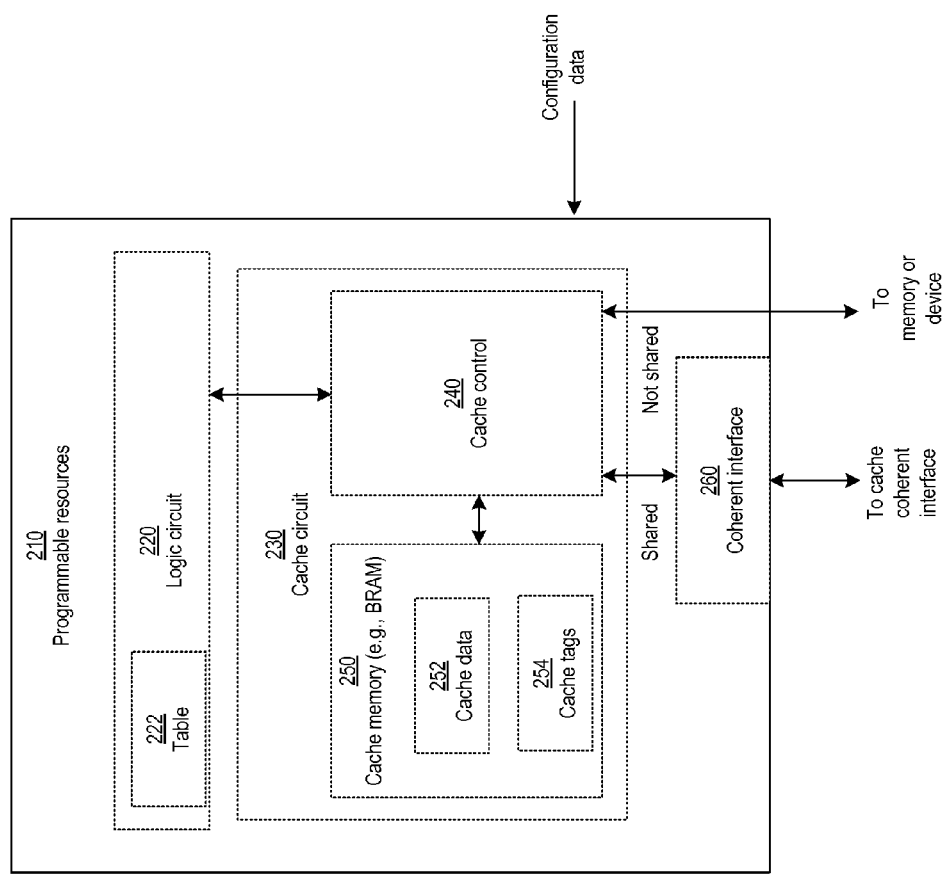
FIG. 2 shows a set of programmable resources configured to implement an example set of circuits for caching shared data, consistent with one or more implementations.

FIG. 2 shows a set of programmable resources configured to implement an example set of circuits for caching shared data. The set of programmable resources 210 is programmed by a set of configuration data to implement a logic circuit 220, cache circuit 230 and a coherent interface 260. The logic circuit 220 is configured to access memory addresses that are shared with a processing sub-system (e.g., FIG. 1, 110). The cache circuit 230 is configured to cache data in a cache memory 250 for a first set of memory addresses, which are shared by the logic circuit and the processing sub-system.

The coherent interface 260 is configured to communicate data transactions between the cache circuit and a cache coherent interconnect (e.g., FIG. 1, 150) to maintain coherence of cached data values for the shared memory addresses. In some implementations, for example, the coherent interface 260 is configured to invalidate a data value cached by the cache circuit 230 in response to a message from the cache coherent interconnect indicating that the cache circuit has lost cache line ownership. The coherent interface 260 is further configured to forward a data transaction request for one of the shared memory addresses to the cache coherent interconnect in response to a cache miss for the shared memory address in the cache memory 250.

In some applications, the logic circuit 220 may also be configured to access memory addresses that are not shared and do not require cache coherence between the processing and programmable logic sub-systems. For ease of reference, memory addresses that are not shared between the processing and programmable logic sub-systems may be referred to as unshared memory addresses. The data values for unshared memory addresses may or may not be cached in various implementations.

In some implementations, the cache circuit 230 includes a cache control circuit 240 that is configured to route outgoing data transaction requests (e.g., for cache misses and/or for uncached addresses) differently depending on whether the data transaction request indicates a shared address. The cache control circuit 240 routes outgoing data transaction requests indicating shared addresses to the coherent interface. The cache control circuit 240 routes data transaction requests for memory addresses that are not shared using a data path that bypasses the coherent interface 260.

In some implementations, data transaction requests issued by the logic circuit 220 each include an attribute indicating whether or not data for the memory address indicated in the data transaction request is to be cached in the logic circuit. The attribute may be set by the logic circuit 220 based on data indicated in a table 222 included in the logic circuit. For instance, the table 222 may include data that indicates whether each memory address accessed by the logic circuit is a shared memory address, for which data values are to be cached by the cache circuit. The data may include, for example, a list of memory addresses that are to be cached or a list of memory addresses that should not be cached. Alternatively, the cache circuit 230 may include table 222 and may determine whether or not data transaction requests correspond to shared memory addresses based on data stored in the table.

The cache memory 250 includes at least a first portion of memory 252 for storing cache data. In some implementations, the cache memory 250 may include a second portion of memory 254 for storing cache tag data. Cache tags may be used, for example, to map indexes of the cache data memory 252 to memory addresses indicated in the data transaction requests. In some implementations, the table 222 may alternatively be stored in a third portion (not shown) of the cache memory 250.

The cache memory 250 may be implemented using various types of memory that may be available in the programmable resources and which may differ from the type of memory used for the cache in the processing sub-system. In some implementations, cache memory 250 may be implemented using block RAM (BRAM). BRAM includes small memory blocks that may be programmed to operate as various memory circuits including, for example, a look up table or a FIFO buffer. Several BRAM blocks may be connected together to operate as a larger memory array.

Figure 3:
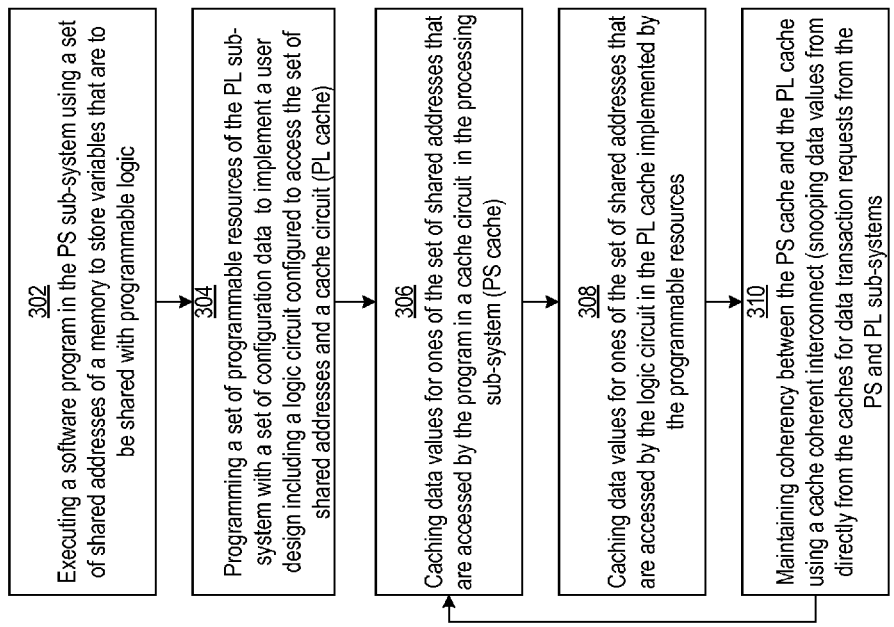
FIG. 3 shows a process for operating processing and programmable logic sub-systems of a programmable IC, consistent with one or more implementations.

FIG. 3 shows a process for operating processing and programmable logic sub-systems of a programmable IC for cache coherence. At block 302, a software program is executed in the processing (PS) sub-system using a set of shared addresses of a memory to store variables that are to be shared. At block 304, a set of programmable resources of the programmable logic (PL) sub-system are programmed with a set of configuration data to implement a user design. The user design includes a logic circuit configured to access the set of shared addresses and includes a cache circuit. At block 306, data values for one or more of the set of shared addresses that are accessed by the program are cached in a cache circuit (PS cache), which is included in and forms part of the processing sub-system. At block 308, data values for ones of the set of shared addresses that are accessed by the logic circuit are cached in the PL cache implemented by the programmable resources. At block 310, coherency between the PS cache and PL cache is maintained using a cache coherent interconnect. As described with reference to FIG. 1, the cache coherent interconnect may snoop data values directly from the PL and PS caches for data transaction requests received from the PS and PL sub-systems. The caching and maintaining of coherency is repeated at blocks 306, 308, and 310 throughout execution of the software program and operation of the logic circuit.

Figure 4:
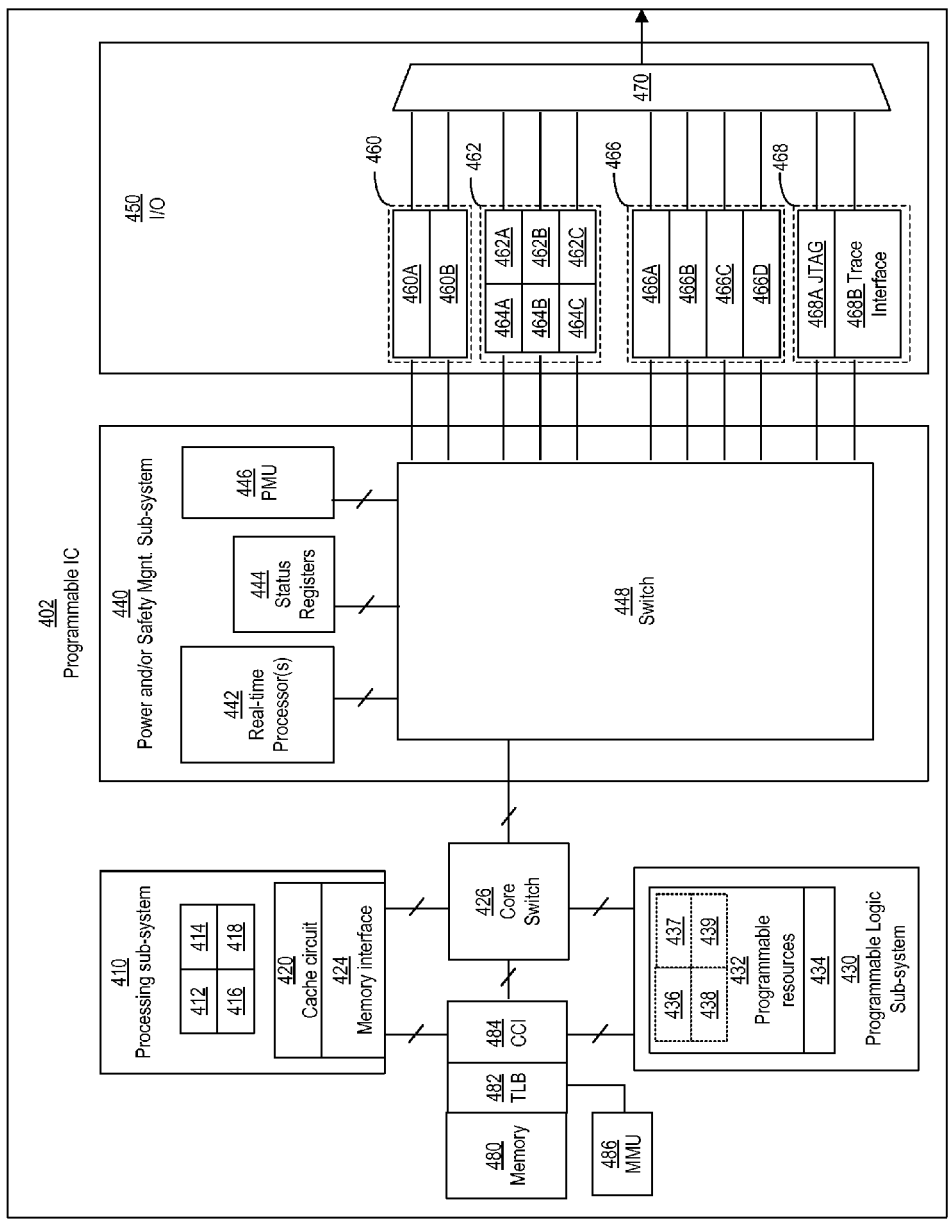
FIG. 4 shows a programmable IC that may be configured in accordance with one or more implementations.

FIG. 4 shows a programmable IC that may be configured in accordance with one or more implementations. The programmable IC may also be referred to as a System On Chip (SOC), which includes a processing sub-system 410 and a programmable logic sub-system 430. The processing sub-system 410 may be programmed to implement a software portion of the user design, via execution of a user program. The program may be specified as part of a configuration data stream or may be retrieved from an on-chip or off-chip data storage device. The processing sub-system 410 may include various circuits 412, 414, 416, and 418 for executing one or more software programs. The circuits 412, 414, 416, and 418 may include, for example, one or more processor cores, floating point units (FPUs), and/or an interrupt processing unit. The processing system 410 includes a cache circuit 420 for caching addresses of a memory (e.g., 480) used by the 412, 414, 416, and 418 for storage of variables during execution of software programs. The processing system 410 may also include a memory interface 424 configured to maintain coherency between the memory 480 and the cache circuit 420.

The programmable logic sub-system 430 of the programmable IC 402 may be programmed to implement a hardware portion of a user design. For instance, the programmable logic sub-system may include a number of programmable resources 432, which may be programmed to implement a set of circuits specified in a configuration data stream. The programmable resources 432 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 432 may be programmed by loading a configuration data stream into the configuration memory cells, which define how the programmable interconnect circuits and programmable logic circuits are configured. The collective states of the individual memory cells then determine the function of the programmable resources 432. The configuration data can be read from memory (e.g., from an external PROM) or written into the programmable IC 402 by an external device. In some implementations, configuration data may be loaded into configuration memory cells by a configuration controller 434 included in the programmable logic sub-system 430. In some other implementations, the configuration data may be loaded into the configuration memory cells by a start-up process executed by the processing sub-system 410.

In accordance with some of the above various implementations, the programmable resources may be configured to implement a logic circuit 438 of a circuit design, a cache circuit 439, a cache control circuit 437, and a coherent memory interface 436. The cache circuit 439 may be implemented using BRAM included in the programmable resources. The coherent memory interface 436 is configured to maintain cache coherency between the cache circuit 439 and the memory 480. The programmable IC 402 also includes a cache coherent interconnect 484 configured to maintain coherency between the cache circuit 420 in the processing sub-system 410 and the cache circuit 439 implemented in programmable resources 432 of the programmable-logic sub-system 430.

The programmable IC 402 may include various circuits to interconnect the processing sub-system 410 with circuitry implemented within the programmable logic sub-system 430. In this example, the programmable IC 402 includes a core switch 426 that can route data signals between various data ports of the processing sub-system 410 and the programmable logic sub-system 430. The core switch 426 may also route data signals between either of the programmable logic or processing sub-systems 410 and 430 and various other circuits of the programmable IC, such as an internal data bus. Alternatively or additionally, the processing sub-system 410 may include an interface to directly connect with the programmable logic sub-system—bypassing the core switch 426. Such an interface may be implemented, for example, using the AMBA AXI Protocol Specification (AXI) as published by ARM.

In some implementations, the processing sub-system 410 and the programmable logic sub-system 430 may also read or write to memory locations of an on-chip memory 480 or off-chip memory via memory controller (not shown). The memory controller can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which the memory controller is able to communicate is provided for purposes of illustration only and is not intended as a limitation or to be exhaustive.

As shown in FIG. 4, the programmable IC 402 may include a memory management unit 486 and translation look-aside buffer 482 to translate virtual memory addresses used by the sub-systems 410 and 430 to physical memory addresses used by the memory controller to access specific memory locations.

The programmable IC may include an input/output (I/O) sub-system 450 for communication of data with external circuits. The I/O sub-system 450 may include various types of I/O devices or interfaces including for example, flash memory type I/O devices, higher performance I/O devices, lower performance interfaces, debugging I/O devices, and/or RAM I/O devices.

The I/O sub-system 450 may include one or more flash memory interfaces 460 illustrated as 460A and 460B. For example, one or more of flash memory interfaces 460 can be implemented as a Quad-Serial Peripheral Interface (QSPI) configured for 4-bit communication. One or more of flash memory interfaces 460 can be implemented as a parallel 8-bit NOR/SRAM type of interface. One or more of flash memory interfaces 460 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 450 can include one or more interfaces 462 providing a higher level of performance than memory interfaces 460. Each of interfaces 462A-462C can be coupled to a DMA controller 464A-464C respectively. For example, one or more of interfaces 462 can be implemented as a Universal Serial Bus (USB) type of interface. One or more of interfaces 462 can be implemented as a gigabit Ethernet type of interface. One or more of interfaces 462 can be implemented as a Secure Digital (SD) type of interface.

The I/O sub-system 450 may also include one or more interfaces 466 such as interfaces 466A-466D that provide a lower level of performance than interfaces 462. For example, one or more of interfaces 466 can be implemented as a General Purpose I/O (GPIO) type of interface. One or more of interfaces 466 can be implemented as a Universal Asynchronous Receiver/Transmitter (UART) type of interface. One or more of interfaces 466 can be implemented in the form of a Serial Peripheral Interface (SPI) bus type of interface. One or more of interfaces 466 can be implemented in the form of a Controller-Area-Network (CAN) type of interface and/or an $I^2C$ type of interface. One or more of interfaces 466 also can be implemented in the form of a Triple Timer Counter (TTC) and/or a Watchdog Timer (WDT) type of interface.

The I/O sub-system 450 can include one or more debug interfaces 468 such as processor JTAG (PJTAG) interface 468A and a trace interface 468B. PJTAG interface 468A can provide an external debug interface for the programmable IC 402. Trace interface 468B can provide a port to receive debug, e.g., trace, information from the processing sub-system 410 or the programmable logic sub-system 430.

As shown, each of interfaces 460, 462, 466, and 468 can be coupled to a multiplexer 470. Multiplexer 470 provides a plurality of outputs that can be directly routed or coupled to external pins of the programmable IC 402, e.g., balls of the package within which the programmable IC 402 is disposed. For example, I/O pins of programmable IC 402 can be shared among interfaces 460, 462, 466, and 468. A user can configure multiplexer 470, via a configuration data stream to select which of interfaces 460-468 are to be used and, therefore, coupled to I/O pins of programmable IC 402 via multiplexer 470. The I/O sub-system 450, may also include a fabric multiplexer I/O (FMIO) interface (not shown) to connect interfaces 462-468 to programmable logic circuits of the programmable logic sub-system. Additionally or alternatively, the programmable logic sub-system 430 can be configured to implement one or more I/O circuits within programmable logic. In some implementations, the programmable IC 402 may also include a sub-system 440 having various circuits for power and/or safety management. For example, the sub-system 440 may include a power management unit 446 configured to monitor and maintain one or more voltage domains used to power the various sub-systems of the programmable IC 402. In some implementations, the power management unit 446 may disable power of individual sub-systems, when idle, to reduce power consumption, without disabling power to sub-systems in use.

The sub-system 440 may also include safety circuits to monitor the status of the sub-systems to ensure correct operation. For instance, the sub-system 440 may include one or more real-time processors 442 configured to monitor the status of the various sub-systems (e.g., as indicated in status registers 444). The real-time processors 442 may be configured to perform a number of tasks in response to detecting errors. For example, for some errors, the real-time processors 442 may generate an alert in response to detecting an error. As another example, the real-time processors 442 may reset a sub-system to attempt to restore the sub-system to correct operation. The sub-system 440 includes a switch network 448 that may be used to interconnect various sub-systems. For example, the switch network 448 may be configured to connect the various sub-systems 410, 430, and 440 to various interfaces of the I/O sub-system 450. In some applications, the switch network 448 may also be used to isolate the real-time processors 442 from the sub-systems that are to be monitored. Such isolation may be required by certain application standards (e.g., IEC-61508 SIL3 or ISO-26262 standards) to ensure that the real-time processors 442 are not affected by errors that occur in other sub-systems.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A system, comprising:
a first memory;
a processing sub-system including:
one or more processing circuits configured to access a first set of addresses of the first memory;
a first cache circuit configured to cache the first set of addresses of the first memory;
a first coherent interface circuit configured to communicate data transactions between the first cache circuit and the first memory;
a programmable logic sub-system including a set of programmable resources configured to implement:
a logic circuit specified in a set of configuration data and configured to access the first set of addresses of the first memory;
a second cache circuit configured to cache the first set of addresses of the first memory; and
a second coherent interface circuit configured to communicate data transactions between the second cache circuit and the first memory;
a communication device coupled to a cache coherent interconnect configured to access the first memory without caching data from the first memory; and
the cache coherent interconnect configured to maintain coherency and ownership between the first cache circuit and the second cache circuit for the first set of addresses; and
in response to a write request to a first address of the first set of addresses from the communication device:
forward the write transaction to the first memory; and
invalidate the first address in one of the first cache circuit or second cache circuit having ownership of the first address.

2. The system of claim 1, wherein:
the logic circuit is further configured to access a second set of addresses that are not cached by the second cache circuit; and
the second cache circuit includes a cache memory and a cache control circuit configured to:
route data transaction requests that indicate one of the first set of addresses from the logic circuit to the second cache circuit; and
route data transaction requests that indicate one of the second set of addresses on a data path that bypasses the cache memory and second coherent interface circuit.

3. The system of claim 2, wherein the logic circuit is configured to access the first set of addresses of the first memory by issuing data transaction requests, each of the data transaction requests including a respective address and an attribute indicating whether or not the address is to be cached in the cache memory.

4. The system of claim 3, wherein the logic circuit includes a table indicating addresses of the first memory that are to be cached in the cache memory.

5. The system of claim 2, wherein the one or more processing circuits are further configured to access a third set of addresses that are not accessed by the logic circuit of the programmable logic sub-system.

6. The system of claim 2, wherein the cache memory includes:
a second memory for storing cached data values; and a third memory for storing cache tags, which map indexes of the second memory to addresses of the first memory.

7. The system of claim 2, wherein the cache memory is implemented in block ram (BRAM) included in the set of programmable resources.

8. The system of claim 1,
wherein the cache coherent interconnect is further configured to, in response to a read transaction from the communication device that indicates a third address of the first set of addresses:
determine one of the processing sub-system or programmable logic sub-system having ownership of the third address; and
retrieve a cached data value for the third address from the determined one of the first and second cache circuits without changing cache line ownership and without first flushing the cached data value from the determined one of the first and second cache circuits to the first memory.

9. The system of claim 1, wherein the set of programmable resources are further configured to implement the cache coherent interconnect.

10. The method of claim 1, wherein the cache coherent interconnect is further configured to:
determine, in response to a first data transaction request from the processing sub-system for a cache miss, whether or not the programmable logic sub-system has ownership of a second address indicated in the first data transaction request; and
retrieve a cached data value of the second address from the second cache circuit and transfer ownership of the second address to the processing sub-system in response to determining the programmable logic sub-system has ownership of the second address.

11. The method of claim 1, wherein the cache coherent interconnect is further configured to:
determine, in response to a second data transaction request from the programmable logic sub-system for a cache miss, whether or not the processing sub-system has ownership of a third address indicated in the second data transaction request;
retrieve a cached data value of the second address from the first cache circuit and transfer ownership of the third address to the programmable logic sub-system in response to determining the processing sub-system has ownership of the third address.

12. A method of operating a programmable integrated circuit (IC), comprising:
executing a software program with a processing circuit of a processing sub-system of the programmable IC using a first set of addresses of a memory to store one or more variables of the software program;
caching data values for the first set of addresses of the memory in a first cache circuit included in the processing sub-system;
operating a logic circuit and a second cache circuit in programmable resources of a programmable logic sub-system of the programmable IC, wherein the logic circuit is configured to access the first set of addresses of the memory;
caching data values for the first set of addresses of the memory in the second cache circuit implemented in the programmable logic sub-system; and
maintaining coherency and ownership between the first cache circuit and the second cache circuit for the first set of addresses using a cache coherent interconnect coupled to the memory, the processing sub-system, and the programmable logic sub-system; and
in response to the cache coherent interconnect receiving from a device that does not cache data for the first set of addresses, a write transaction request indicating a first address of the first set of addresses:
forwarding the write transaction request to the memory,
determining which one of the first or second cache circuits is assigned cache line ownership for the first address, and
invalidating a data value for the first address in the determined one of the first or second cache circuits.

13. The method of claim 12, further comprising in response to a cache miss for a second address of the first set of addresses in the processing sub-system:
providing a first data transaction request indicating the first address to the cache coherent interconnect using a first coherent interface in the processing sub-system;
in response to the cache coherent interconnect receiving the first data transaction request from the first coherent interface, retrieving a first data value corresponding to the first second address from the second cache circuit included in the programmable logic sub-system;
providing the first data value to the first coherent interface; and
assigning cache line ownership for the second address to the first cache circuit included in the processing sub-system.

14. The method of claim 13, further comprising, in response to a cache miss for a third address of the first set of addresses in the programmable logic sub-system:
using a second coherent interface in the programmable logic sub-system, providing a second data transaction request indicating the third address to the cache coherent interconnect;
in response to the cache coherent interconnect receiving the second data transaction request from the second coherent interface, retrieving a second data value corresponding to the third address from the first cache circuit included in the processing sub-system;
providing the second data value to the second coherent interface; and
assigning cache line ownership for the third address to the first cache circuit included in the processing sub-system.

15. The method of claim 14, further comprising programming the programmable resources of the programmable logic sub-system to implement the logic circuit, the second cache circuit, and the second coherent interface using a set of configuration data.

16. The method of claim 15, further comprising programming the programmable resources of the programmable logic sub-system to implement the cache coherent interconnect using the set of configuration data.

17. The method of claim 14, further comprising, in response to the logic circuit issuing a third data transaction request:
routing the third data transaction request to the second coherent interface in response to the third data transaction request indicating one of the first set of addresses that is not cached in the second cache circuit; and
routing the third data transaction request on a data path that bypasses the second coherent interface in response to the third data transaction request indicating an address not included in the first set of addresses.

18. The method of claim 17, wherein the third data transaction request includes an attribute indicating whether or not the data for the address indicated in the third data transaction request should be cached in the second cache circuit.

19. The method of claim 12, further comprising in response to the cache coherent interconnect receiving a read transaction request, indicating a second address of the first set of addresses, from the device:
   determining which one of the first or second cache circuits is assigned cache line ownership for the second address;
   retrieving a data value for the third address from the determined one of the first or second cache circuits.

* * * * *